(12) United States Patent
Patel et al.

(10) Patent No.: US 7,142,996 B2
(45) Date of Patent: Nov. 28, 2006

(54) OPERATING VOLTAGE DETERMINATION FOR AN INTEGRATED CIRCUIT

(75) Inventors: Dipesh Ishwerbhai Patel, Saffron Walden (GB); Krisztian Flautner, Cambridge (GB)

(73) Assignee: ARM Limited, Cambridge (GB)

( * ) Notice: Subject to any disclaimer, the term of this patent is extended or adjusted under 35 U.S.C. 154(b) by 32 days.

(21) Appl. No.: 10/912,104

(22) Filed: Aug. 6, 2004

(65) Prior Publication Data

US 2005/0107967 A1  May 19, 2005

(30) Foreign Application Priority Data

Nov. 14, 2003  (GB) ................................ 0326612.9

(51) Int. Cl.
*G01R 31/36* (2006.01)
*G06F 19/00* (2006.01)

(52) U.S. Cl. ...................................................... 702/64
(58) Field of Classification Search ................... 702/64
See application file for complete search history.

(56) References Cited

U.S. PATENT DOCUMENTS

| 5,627,412 | A | 5/1997 | Beard |
| 6,208,542 | B1 * | 3/2001 | Wang et al. ................... 365/45 |
| 2003/0204349 | A1 | 10/2003 | Ando |
| 2004/0025061 | A1 * | 2/2004 | Lawrence ................... 713/300 |

FOREIGN PATENT DOCUMENTS

| WO | 03/036448 | 5/2003 |
| WO | 03/062972 | 7/2003 |

* cited by examiner

Primary Examiner—John Barlow
Assistant Examiner—Sujoy Kundu
(74) Attorney, Agent, or Firm—Nixon & Vanderhye P.C.

(57) ABSTRACT

Voltage-binning of individual integrated circuits is achieved by operating those integrated circuits at a plurality of required clock frequencies and for each of those frequencies determining the minimum supply voltage level which produces a pass result for a series of applied test vectors.

40 Claims, 6 Drawing Sheets

OPERATING VOLTAGE DETERMINATION FOR AN INTEGRATED CIRCUIT

BACKGROUND OF THE INVENTION

1. Field of the Invention

This invention relates to the field of integrated circuits. More particularly, this invention relates to the determination of operating voltages for integrated circuits.

2. Description of the Prior Art

In the field of integrated circuits there is a drive to increase processing performance by running integrated circuits at progressively higher clocking frequencies. As a consequence of manufacturing tolerances within integrated circuits, a given integrated circuit may not be capable of operating reliably at the intended clocking frequency for a given supply voltage. Accordingly, at the production stage following fabrication, each integrated circuit is tested at a range of test frequencies to determine the highest operating frequency that it can support at the given supply voltage. The integrated circuits are then categorised for use up to that highest operating frequency.

There is also a drive in the field of integrated circuits to improve the energy efficiency of integrated circuits and operate at lower voltages. More power efficient systems have the advantage of prolonging battery life in the end devices in which the integrated circuits are incorporated and of also reducing unwanted heat generation.

SUMMARY OF THE INVENTION

According to a first aspect the invention provides a method of determining an operating voltage for an individual integrated circuit, said method comprising:

running said integrated circuit at a required operating frequency;

executing a test sequence of data processing operations on said integrated circuit to exercise critical paths of said integrated circuit at each of at least a subset of a set of test voltages, wherein successful execution of said test sequence at a given test voltage indicates that said integrated circuit can reliably sustain said required operating frequency at said given test voltage;

identifying a lowest test voltage from said subset of test voltages for which said test sequence was successfully executed;

determining said operating voltage for said individual integrated circuit at said required operating frequency in dependence upon said lowest test voltage.

The present invention recognises that rather than categorising groups of integrated circuits according to the highest frequencies that they can reliably support at a given supply voltage, individual integrated circuits may be categorised according to the lowest voltage that is required to reliably sustain a required operating frequency. This means that variations in the integrated circuit fabrication, such variations as doping levels, can be taken into account on a circuit by circuit basis by actively testing the lowest voltage that an individual integrated circuit can sustain in order to reliably operate at the required frequency. This means that, unlike known frequency binning techniques, there is no need to build in substantial margins into the specified operating voltage (effectively increasing the operating voltage significantly above the required minimum voltage) to account for variations in the fabrication process. Accordingly, on a specific integrated circuit the operating voltage determined according to the present technique may be lowered by hundreds of millivolts with regard to the operating voltage determined for the corresponding group of frequency binned integrated circuits. Running at a lower operating voltage makes more efficient use of available energy.

Although the operating voltage could be determined for a single required operating frequency, in preferred embodiments the operating voltage is determined for a plurality of required operating frequencies. This is particularly useful in data processing devices that support multiple operating points since an energy efficient voltage can be individually determined for each of the possible clocking frequencies.

In preferred embodiments the test sequence of data processing operations used to exercise critical paths of the integrated circuit is either a sequence of data processing instructions, for example executed by a computer program, or a sequence of test signals applied to the integrated circuit, for example by hardware.

Although the determined operating voltage could be any voltage or combination of voltages applied to the individual integrated circuit, in preferred embodiments the operating voltage is either a supply level voltage or a body bias voltage. Either the body bias voltage or the supply level voltage may be adjusted in a manner that enables support to be provided for the required clock frequency yet allows for more efficient use of energy. Furthermore, the body bias voltage may be determined and tuned to control the leakage current during standby operation of the integrated circuit.

It will be appreciated that the operating voltage could be determined such that it is substantially equal to the lowest test voltage. However, in preferred embodiments, the operating voltage is determined such that it is higher than the lowest test voltage by a predetermined amount. This reduces the likelihood of failure of the integrated circuit due to the lowest test voltage not being able to support the required frequency when there is a change in environmental conditions or due to any errors in identification of the lowest test voltage.

It will be appreciated that the set of voltages could be tested in any order such as the order in which they are retrieved from a look-up table in memory. Furthermore, different subsets of the set of test voltages may be tested at different times. However, in preferred embodiments the test sequence is first executed at the highest test voltage of the set and the test voltage is progressively reduced until a value is encountered at which successful execution of the test sequence fails. This makes the testing process more time-efficient since it reduces the subset of voltages from the set that need be tested by eliminating all test voltages lower than a failed test voltage.

Although the determined operating voltage and required operating frequency could be stored in a storage module that is distinct from the integrated circuit, in preferred embodiments the operating voltage and required operating frequency are stored in a storage module that is associated with the individual integrated circuit such as, for example, in programmable read only memory or on a bar code applied to the packaging of the integrated circuit. This allows an appropriate operational voltage level to be applied to the individual integrated circuit at the time of its implementation in a larger system or in an end device.

It will be appreciated that the operating voltage determination could be performed at any of several different stages of implemention of the integrated circuit. According to one preferred embodiment the operating voltage determination is performed upon fabrication of the integrated circuit thus allowing the individual integrated circuit to be categorised according to the lowest test voltage for the required frequency before its incorporation in a larger circuit. This allows for the operating voltage to be fine-tuned such that it is appropriate to the individual integrated circuit rather than generally appropriate for a batch of categorised integrated circuits.

According to a further preferred embodiment the operating voltage determination is performed upon coupling the integrated circuit to further circuit elements within a larger circuit. Thus, the operating voltage determination is assessed in the context of the actual processing environment in which the integrated circuit is situated so that environmental parameters, such as temperature, that are specific to the larger circuit and that may affect the lowest test voltage are taken into account.

According to a yet further preferred embodiment the operating voltage determination is performed whilst the integrated circuit is incorporated within an end device. Again, this enables the actual processing environment to be taken into account in determining the lowest test voltage.

It will be appreciated that the operating voltage determination may be performed at any time and could be repeated any number of times as required. However, it is preferred that when the integrated circuit is incorporated within an end device the operating voltage determination is performed at at least one of a first boot of the end device and every boot of the end device. Voltage determination at first boot ensures that the operating voltage is appropriate for the specific operating environment of the end device and specifically tuned to the individual integrated circuit within the end device, rather than being pre-set according to voltage margins appropriate for a batch of integrated circuits. Voltage determination on every boot of the end device enables the determined operating voltage to be recalculated so that if for example any modifications have been made to the end device, these may be taken into account on the next boot of the end device.

According to a further preferred embodiment the operating voltage determination is performed periodically during operation of the end device so that prevailing operating conditions such as temperature and processing workload can be taken into account.

In preferred embodiments a state of the end device is saved prior to performing the operating voltage determination and the state is restored after the operating voltage has been determined. This allows the voltage determination to be performed at times other than boot up of the device, that is, during normal operation without compromising the processing operations being performed by the device prior to initiation of the operating voltage determination process.

Although the operation voltage determination could be performed at any time, in preferred embodiments the operating voltage determination is performed upon detection of one or more predetermined operating conditions of the end device. In particular, on determination of a predetermined temperature change, the predetermined temperature change (for example 5° C.) being of a magnitude likely to result in a change in the operating voltage needed to support the required clocking frequency. Furthermore the operational voltage determination could be performed in dependence upon whether the end device is operating from a mains power supply or a battery power supply. Accordingly, a more energy efficient operating voltage may be used only when there is a desire to prolong the lifetime of the battery.

Although the operational voltage determination could be performed only on boot up or during normal operation of the end device, in preferred embodiments operational voltage determination is initiated when the integrated circuit within the end device is in a standby state to identify a body bias voltage that results in a lowest leakage current for a current charge level of the battery. This provides a mechanism for reducing power consumption in standby mode thereby prolonging battery lifetime.

According to a second aspect the invention provides an apparatus comprising:

an individual integrated circuit;

a storage module associated with said individual integrated circuit storing an operating voltage and a required operating frequency for said individual integrated circuit, the operating voltage having been determined by:

running said integrated circuit at said required operating frequency;

executing a test sequence of data processing operations on said integrated circuit to exercise critical paths of said integrated circuit at each of at least a subset of a set of test voltages, wherein successful execution of said test sequence at a given test voltage indicates that said integrated circuit can reliably sustain said required operating frequency at said given test voltage;

identifying a lowest test voltage from said subset of test voltages for which said test sequence was successfully executed;

determining said operating voltage for said individual integrated circuit at said required operating frequency in dependence upon said lowest test voltage.

According to a third aspect the invention provides a computer program product bearing a computer program for controlling a data processing apparatus to determine an operating voltage for an individual integrated circuit, said computer program comprising:

frequency setting code operable to run said integrated circuit at a required operating frequency;

execution code operable to execute a test sequence of data processing operations on said integrated circuit to exercise critical paths of said integrated circuit at each of at least a subset of a set of test voltages, wherein successful execution of said test sequence at a given test voltage indicates that said integrated circuit can reliably sustain said required operating frequency at said given test voltage;

voltage identifying code operable to identify a lowest test voltage from said subset of test voltages for which said test sequence was successfully executed; and operating voltage determining code operable to determine said operating voltage for said individual integrated circuit at said required operating frequency in dependence upon said lowest test voltage.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
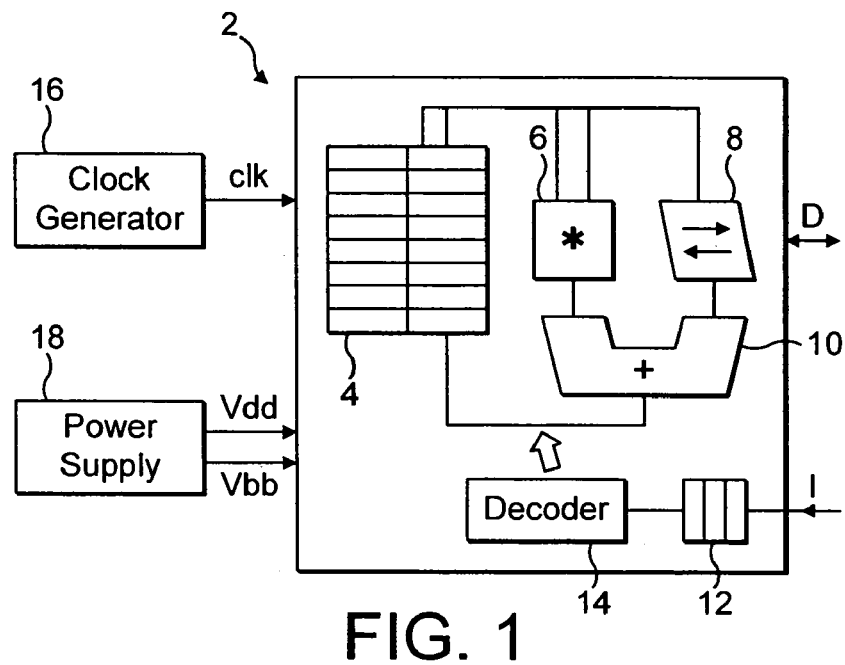
FIG. 1 schematically illustrates an integrated circuit in the form of a processor core (CPU)

FIG. 1 illustrates an integrated circuit 2 in the form of a processor core incorporating a register bank 4, a multiplier 6, a shifter 8, an adder 10, an instruction pipeline 12 and an instruction decoder 14. In operation program instructions received into the instruction pipeline 12 are decoded by the instruction decoder 14 which generates control signals for controlling the operation of the register bank 4, the multiplier 6, the shifter 8 and the adder 10 as well as further circuit elements (not illustrated) to perform data processing operations specified by the program instructions.

The integrated circuit 2 is supplied by a processor clock signal clk generated by a clock generator 16. This clock signal clk can have different frequencies, these frequencies being dynamically altered depending upon the performance required of the integrated circuit 2 at a particular point in time. As an example, if the integrated circuit 2 is required to perform a processing intensive task, such as moving image decoding and display, then the clock frequency will be set to a high value so as to yield the desired processing performance. Conversely, when the processor is idle, the clock frequency can be set to a low value so reducing power consumption.

A power supply 18 is also coupled to the integrated circuit 2 and supplies a supply rail voltage Vdd as well as a body bias voltage Vbb to the integrated circuit 2. For a given clock frequency there will be a minimum required supply rail voltage Vdd needed to support operation at that clock frequency. If the supply rail voltage falls below this minimum value then one or more critical paths within the integrated circuit 2 will be unable to complete their operation within the required time determined by the clock frequency and the integrated circuit will fail to operate correctly, i.e. in the case of a processor core the system will crash.

The body bias voltage Vbb may be varied to control the leakage current during standby operation of the integrated circuit, i.e. when the integrated circuit is not being clocked but is required to hold state. As an alternative, the supply rail voltage may be constant for different clock frequencies but the body bias voltage adjusted for those different frequencies to thereby adjust the difference between the supply rail voltage and the body bias voltage in a manner which enables support to be provided to the different required clock frequencies.

It will be appreciated that the desire to operate an integrated circuit at the minimum necessary supply rail voltage needed for a given clock frequency is derived from a desire to reduce the energy consumption of the integrated circuit. Reduced energy consumption is advantageous as it can give increased battery life in mobile computing devices, reduced energy density and heating problems in high performance devices and for other reasons. Similarly, the reduction in the leakage current during standby is also desirable for reducing energy consumption and heat generation and extending battery life.

Figure 2:
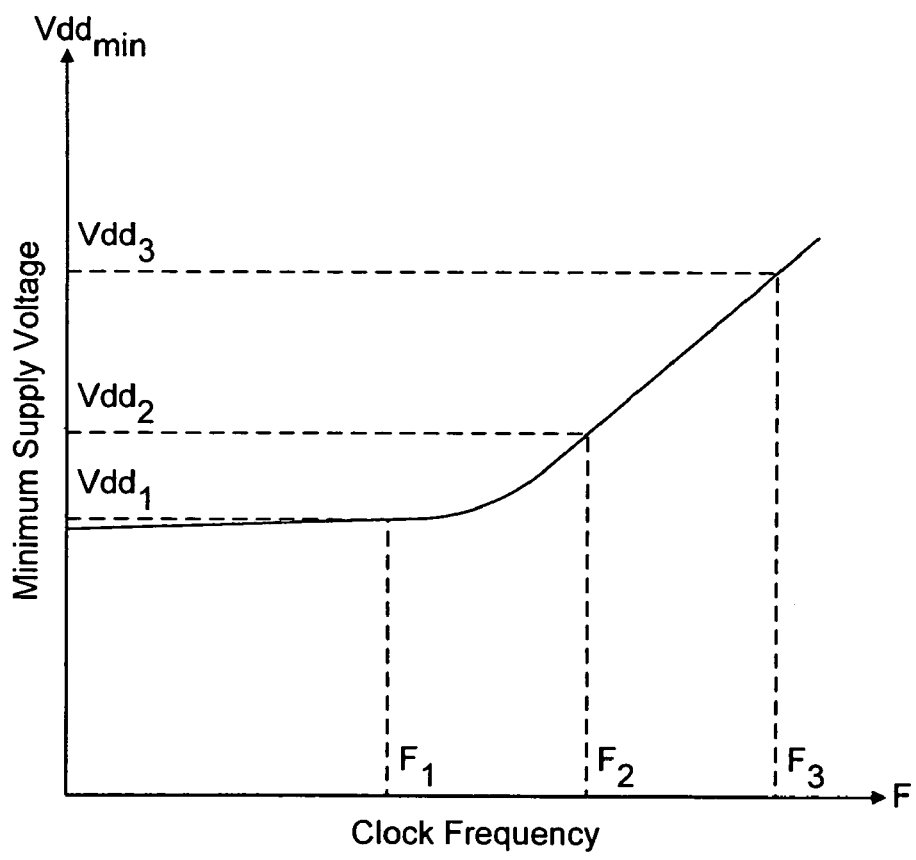
FIG. 2 is a graph schematically representing the relationship between the minimum required supplied rail voltage and operational clock frequency of an integrated circuit.

FIG. 2 schematically illustrates the relationship between the minimum required supply rail voltage $Vdd_{min}$ and the clock frequency which it is required to support. It will be seen that the minimum supply voltage $Vdd_{min}$ generally reduces as the required clock frequency reduces but this is a non-linear relationship and below certain clock frequencies the minimum supply rail voltage effectively remains constant. In practice, in order to achieve reliable operation it will be desirable to supply the integrated circuit 2 with a supply rail voltage Vdd which is a little above the minimum determined supply rail voltage $Vdd_{min}$. The margin built in may be relatively small if the minimum supply rail voltage has been calculated for the individual integrated circuit 2 rather than a more cautious determination based upon worst-case scenarios for the general class of integrated circuits concerned. As an example, a worst-case scenario based system might use a supply rail voltage 20% greater than that estimated to be the minimum supply rail voltage for an average integrated circuit in order to provide sufficient buffer that an individual integrated circuit with below average tolerance to low supply rail voltage will still operate correctly. In contrast, when the minimum supply rail voltage has been determined for each individual integrated circuit 2, then a much smaller buffer can be used, e.g. 5%, with a consequent significantly advantageous reduction in energy consumption and heating.

Figure 3:
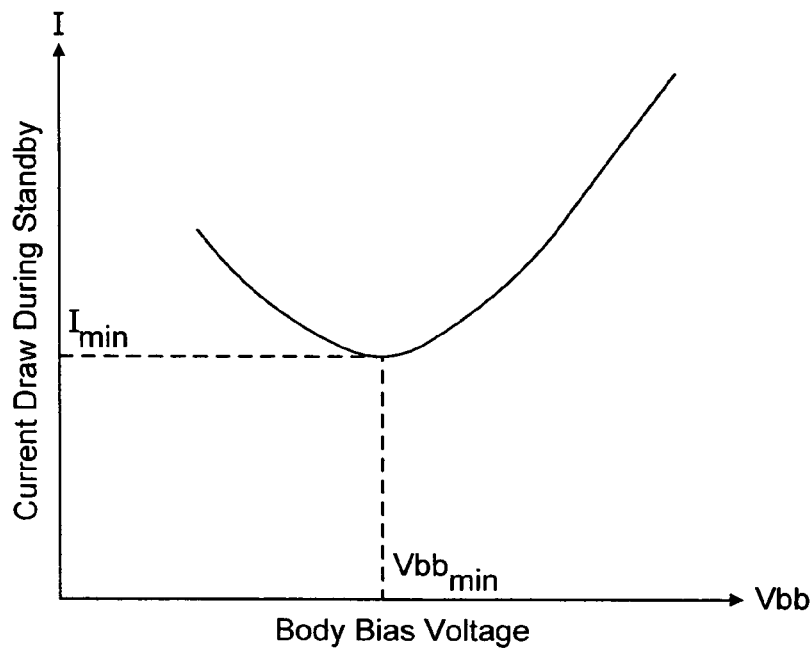
FIG. 3 is a graph schematically illustrating the relationship between current draw during standby and body bias voltage for an integrated circuit.

FIG. 3 schematically illustrates the relationship between current drawn during standby and body bias voltage Vbb for an integrated circuit. During standby operation it is known to stop the clock of an integrated circuit whilst requiring that integrated circuit to maintain its current state. In order to do this the integrated circuit must continue to be supplied with power. However, as integrated circuits start to be formed of ever smaller circuit components the leakage current during the static state of the circuit components starts to become a significant factor. In order to control this leakage current it is known to utilise different body bias voltage levels. For a given individual integrated circuit there will be a body bias voltage that produces the minimum current draw during standby, i.e. a given body bias voltage that minimises the current leakage. This is the relationship which is shown in FIG. 3.

Figure 4:
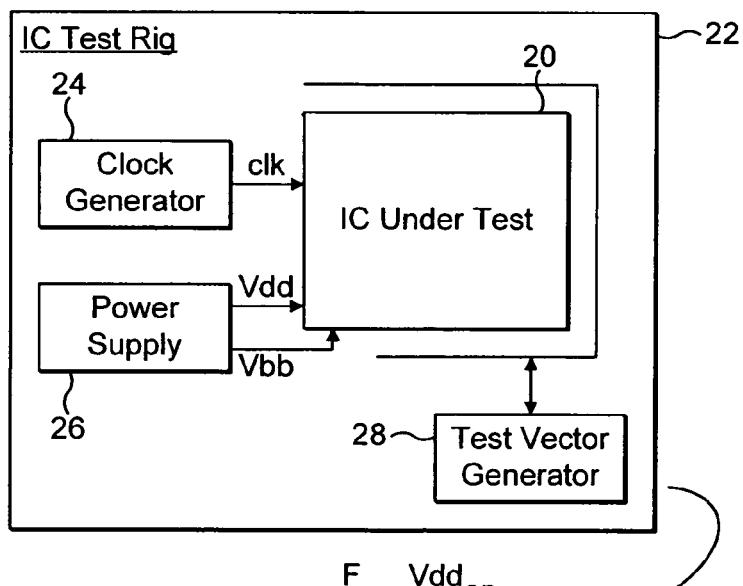
FIG. 4 schematically illustrates an embodiment for characterising an integrated circuit within a test rig upon manufacture of the integrated circuit.

FIG. 4 schematically illustrates an integrated circuit 20 which has been fabricated and packaged. This integrated circuit 20 is inserted within a test rig 22. The test rig 22 includes a clock generator 24 and a power supply 26. The test rig 22 also incorporates a test vector generator 28 which serves to generate test vector signals which are applied to the integrated circuit 20. It will be appreciated that these test vector signals might be applied to input pins of the integrated circuit 20 or scanned into a test scan chain of the integrated circuit 20. These test vectors are designed to stimulate the critical paths of the integrated circuit 20 to determine whether or not those critical paths meet the operational timing requirements. The stimulation of critical paths by test vectors for manufacturing test is a known technique within the integrated circuit field and in itself will not be described further herein.

Testing the critical paths within the integrated circuit 20 with appropriate test vectors to determine a pass/fail result is performed at a plurality of different required clock frequencies at which the integrated circuit 20 is driven by the clock generator 24. At each of these different required clock frequencies the test vectors are applied and a pass/fail result determined at a plurality of different supply rail voltages Vdd. In practice the integrated circuit will pass its test for the applied test vectors whilst the supply rail voltage is above some minimum supply rail voltage $Vdd_{min}$ for the clock frequency concerned as illustrated in FIG. 2. Once the supply rail voltage Vdd falls below this minimum value $Vdd_{min}$, then the integrated circuit will fail the test vectors. Thus, the minimum required supply rail voltage for the clock frequency concerned can be determined for the individual integrated circuit 20.

It will be appreciated that different integrated circuits will have different characteristics as they vary due to variations in the manufacturing process, e.g. variations in the particular doping levels achieved, the accuracy with which the individual integrated circuit has been formed, the characteristics of the packaging of the integrated circuit etc. Thus, rather than relying upon a minimum supply rail voltage determined to be safe for that whole class of integrated circuits using a relatively large safety margin, an individual minimum supply rail voltage can be determined for the particular integrated circuit concerned in a manner which allows for an advantageous reduction in the energy consumption and heat generation of the integrated circuit concerned.

As will be seen in FIG. 4, the sequence of tests performed by the test rig 22 upon the individual integrated circuit 20 results in the determination of a set of operational supply rail voltages associated with different operating frequencies of the integrated circuit 20 together with an operational body bias voltage. These operational values of the supply rail voltage and/or the body bias voltage are set a small margin above the determined minimum values so as to improve reliability due to small changes in the operational characteristics of the integrated circuit with time or other factors, such as environmental factors.

Figure 5:
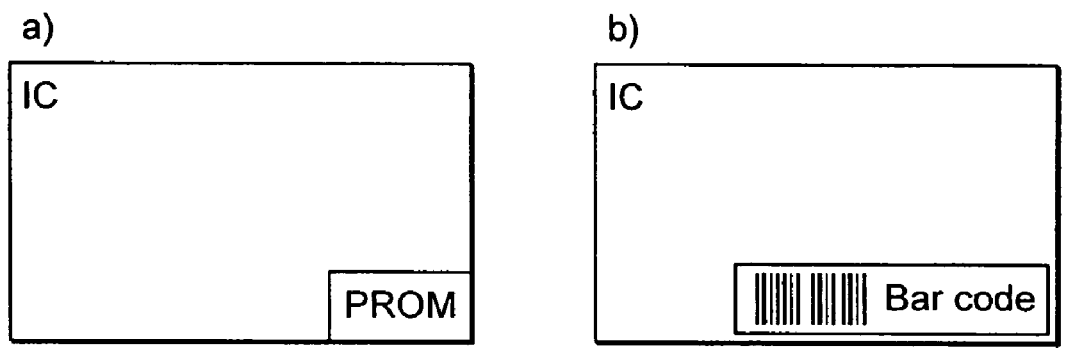
FIG. 5 schematically illustrates two possibilities for storing operational voltage characteristics of an individual integrated circuit associated with that individual integrated circuit.

The data determined for the individual integrated circuit 20 regarding its required supply rail voltage and/or body bias voltage is associated with the integrated circuit concerned. FIG. 5 illustrates two ways in which this data may be associated with the integrated circuit. In embodiment a) the set of supply rail voltages to be used for different required clock frequencies are stored within a programmable read-only memory within the integrated circuit together with the operational body bias voltage. These parameters may then be read from this programmable read-only memory by a power supply circuit which is later used with the individual integrated circuit concerned to enable the power supply circuit to fine-tune the voltages it supplies to match that individual integrated circuit.

The embodiment b) of FIG. 5 illustrates the voltage data determined in relation to FIG. 4 being associated with the individual integrated circuit concerned by being encoded within a barcode upon a sticker applied to the packaging of the integrated circuit. This barcode then travels with the individual integrated circuit after it has been tested within the test rig 22 and may be read automatically during subsequent manufacture operation in a manner which can then be used to program a particular power supply circuit which is to be used with that integrated circuit so as to match the voltages produced by that power supply circuit to the individual integrated circuit concerned.

Figure 6:
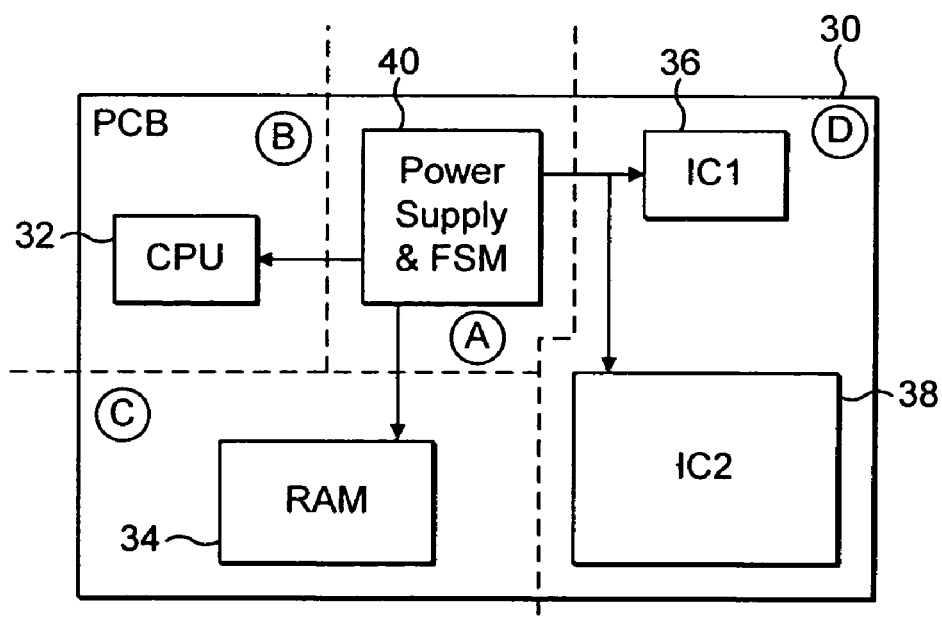
FIG. 6 schematically illustrates a printed circuit board into which an integrated circuit which may be subject to the above characterisation has been inserted and for which multiple voltage domains are provided.

FIG. 6 illustrates a further example embodiment of the present technique. In this embodiment a printed circuit board 30 has been formed incorporating multiple integrated circuits including a CPU 32, a RAM memory 34, further integrated circuits 36, 38 and a power supply and finite state machine controller 40 (this type of arrangement may also be found with a system-on-chip device). The printed circuit board illustrated is shown as being divided into a plurality of different voltage domains, A, B, C and D. These voltage domains may be separately controlled by the power supply and finite state machine controller 40. Thus, the CPU 32 may be supplied with a supply rail voltage which is varied in dependence upon the required operating clock frequency of the CPU 32 at that particular time. The same technique may be used with the RAM memory 34 within the different voltage domain C. The further integrated circuits 36, 38 may share a voltage domain which may be supplied with a constant supply voltage as the integrated circuits concerned may not support multiple voltage levels.

The power supply and finite state machine controller 40 is operable to perform required supply voltage characterisation for the individual CPU 32 which has been built into the printed circuit board 30 concerned. For a given clock frequency and supply rail voltage the test vectors are applied under control of the finite state machine controller and a pass/fail result determined. Starting at the highest supply rail voltage levels and steadily decreasing these a point is reached at which a fail result first occurs. This can be used to determine the minimum required supply rail voltage as being the last voltage which produced a pass result. An operational supply rail voltage may be determined from this last supply rail voltage which produced a pass result by adding some small margin, e.g. a fixed voltage increment or a fixed percentage increment etc.

As previously mentioned, the supply voltage characterisation may be performed as a one-time operation as part of manufacturing test of the printed circuit board 30. Alternatively, this task could be performed when the printed circuit board 30 was first booted when incorporated within an end device or when first booted during part of the testing of the printed circuit board 30. It is also possible that the power supply and finite state machine controller 40 could conduct this voltage characterisation on every subsequent boot of the printed circuit board 30 within the end device or at periodic intervals or upon detection of predetermined environmental conditions as will be described later.

The power supply and finite state machine controller 40 may apply the voltage characterisation technique described above to other of the voltage domains within the printed circuit board 30. As an example, the RAM memory 34 may be capable of operating at different supply voltages within different power consumption characteristics and the power supply and finite state machine controller 40 may be used to determine the operational supply voltage characteristics for the individual RAM memory integrated circuit 34 which has been built into the printed circuit board 30. Other of the voltage domains, such as domain D containing the further integrated circuits 36, 38, may not be capable of supporting multiple operating voltages or of being tested in a pass/fail manner, as may be done by exercising the critical paths of the CPU 32 or the memory storage capabilities of the RAM memory 34, and accordingly the voltage characterisation technique may not be used for these further integrated circuits.

Figure 7:
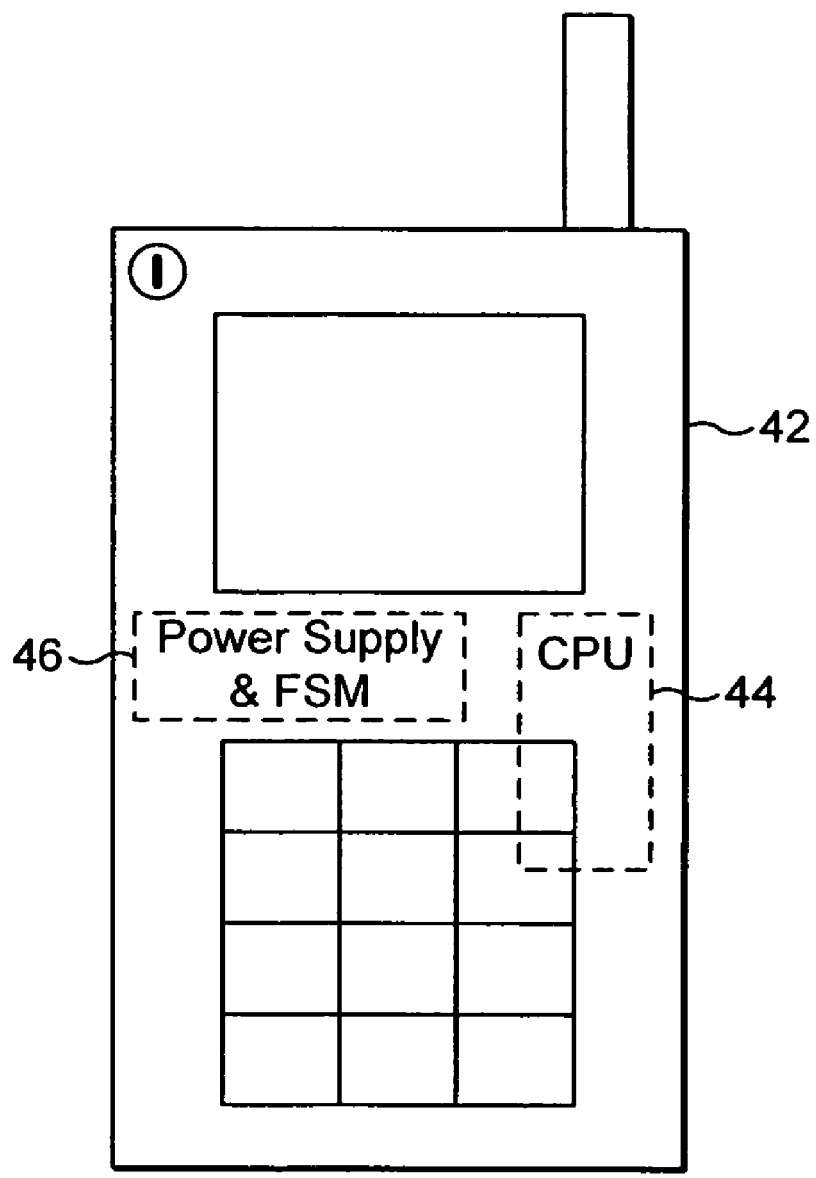
FIG. 7 schematically illustrates an end device, in the form of a mobile telephone, incorporating an integrated circuit which is subject to operational voltage characteristic determination during use.

FIG. 7 illustrates an end device in the form of a mobile telephone 42. This end device could take a variety of different forms beyond that of a mobile telephone, such as a personal digital assistant, a GPS unit, an MP3 player, a digital camera, etc. Within the end device 42 there is included a central processing unit 44 and a power supply and finite state machine controller 46. The required supply voltage characterisation of the CPU 44 may be performed in accordance with the above described techniques by the power supply and finite state machine controller 46 when the CPU 44 has been incorporated within the end device 42. As an example, the characterisation may be performed on the first boot of the 42 (the "golden boot"), on every boot of the device, at periodic intervals, such as every fifteen minutes, or in response to detection of predetermined environmental condition changes, such as a temperature variation of a given size or the removal of a mains power supply requiring a reversion to a battery power supply. Thus, the required supply voltage may be adjusted to match the individual integrated circuit 44 as well as the environmental conditions concerned. The voltage characterisation may be performed on each occasion for the full range of operating frequencies concerned. Alternatively, only the most common of these operating frequencies may be checked regularly with the least common or least likely to change being checked only on the first boot or less frequently that the regular check. Thus, the processing overhead associated with the periodic supply voltage requirement characterisation can be reduced or at least focused upon the most critical values concerned.

Figure 8:
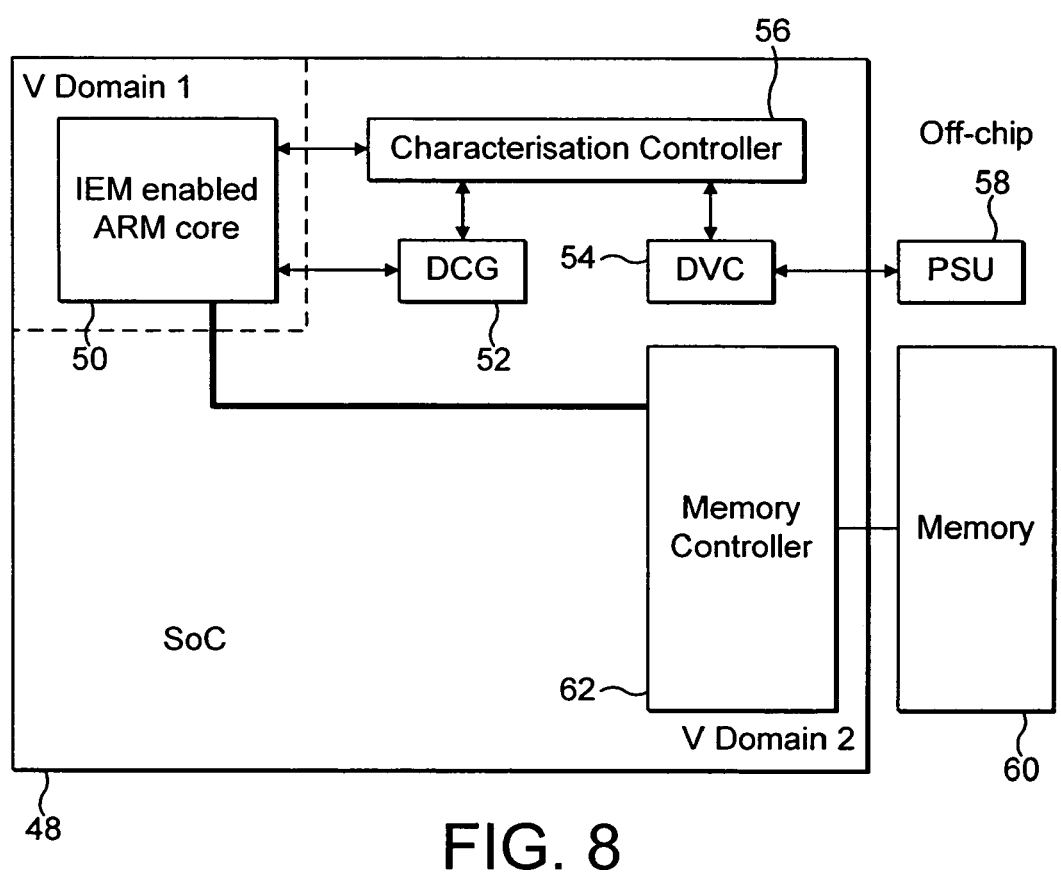
FIG. 8 schematically illustrates a system-on-chip integrated circuit incorporating circuits for the operational voltage characterisation of a processor core within that system-on-chip integrated circuit.

FIG. 8 schematically illustrates a system-on-chip integrated circuit 48 to which the present technique is applied. This integrated circuit 48 includes a processor core 50 which can operate at different clock frequencies generated by a dynamic clock generator 52 and supplied with a plurality of different supply rail voltages generated by a dynamic voltage controller 54. A characterisation controller 56 acts to subject the processor core 50 to the required supply voltage characterisation testing at different clock frequencies as discussed above using clock frequencies generated by the dynamic clock generator 52 at a sequence of supply voltages as controlled by the dynamic voltage controller 54 controlling a power supply unit 58. If this voltage characterisation is to be performed during normal operation of the integrated circuit 48, then it will be appreciated that the state of the system needs to be saved prior to the required supply voltage characterisation testing as this is "destructive testing" since it forces a failure and would otherwise lose state. Accordingly, the characterisation controller 56 triggers storage of the state of the integrated circuit 48 into a memory 60 via a memory controller 62. Once the required supply voltage characterisation has been performed the previous state of the integrated circuit 48 can be restored from the memory 60 and normal processing resumed. The system-on-chip integrated circuit 48 may also have multiple voltage domains with on-chip memory used for store/restore operations as this would reduce the energy cost associated with such store/restore operations.

A system-on-chip system may also include multiple power domains several or all of which may be subject to characterisation for lowest voltage with multiple voltage regulators being provided to supply the necessary voltages.

Figure 9:
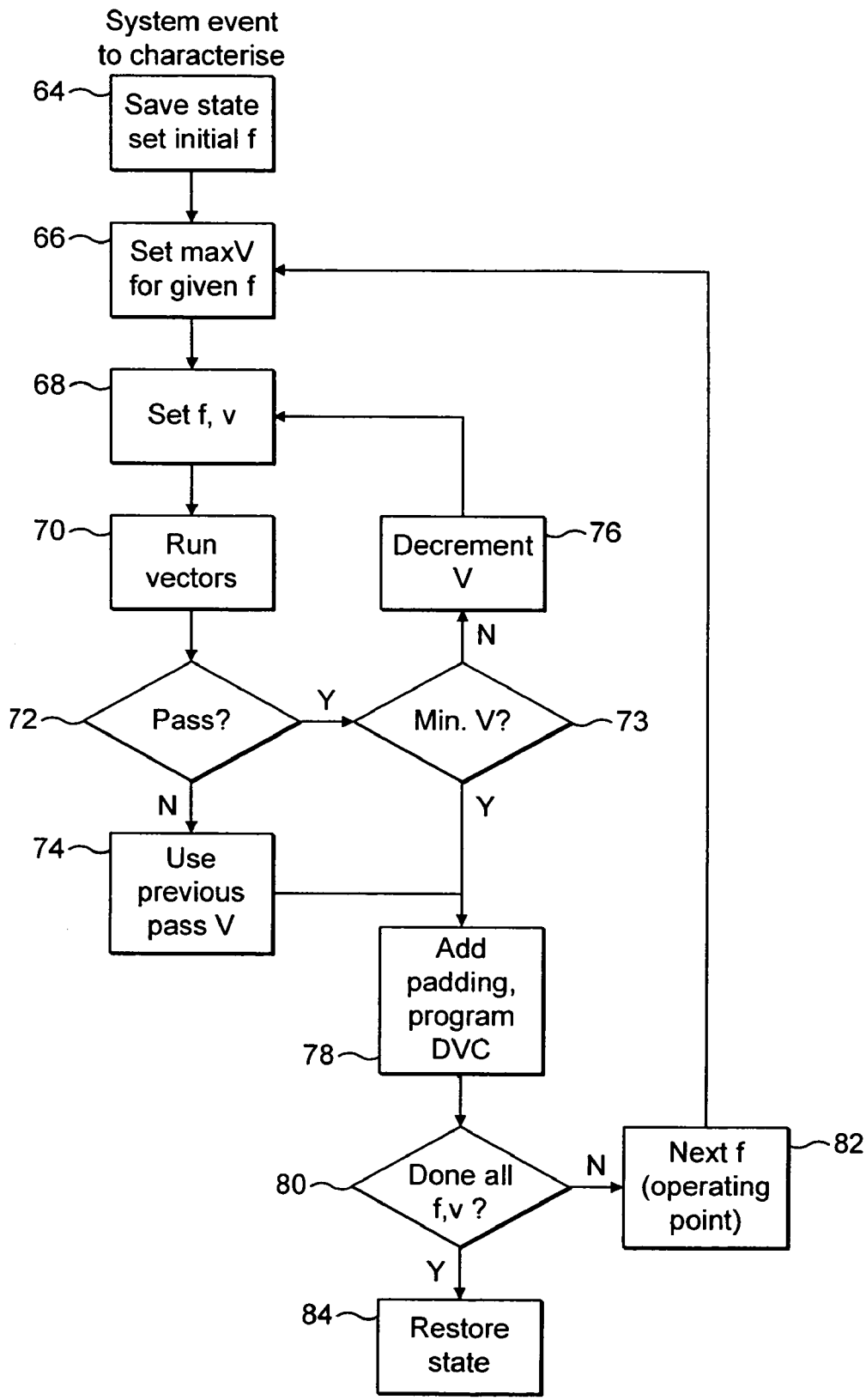
FIG. 9 is a flow diagram schematically illustrating the process for determining the operational voltage characteristics of an integrated circuit.

FIG. 9 is a flow diagram schematically illustrating the required supply voltage characterisation technique. When a characterisation operation is triggered, such as upon a first boot of the device, upon every boot of the device, at a periodic interval, upon detection of a particular change in environmental conditions etc, the system starts processing at step 64 where the initial state of the system is saved and an initial clock frequency to be characterised is set. At step 66 a maximum supply voltage for the clock frequency under test is determined, such as from a lookup table. At step 68, the frequency being tested is set and the voltage is set and applied to the integrated circuit under test. At step 70 the test vectors are run against that integrated circuit. It will be appreciated that in the embodiment of FIG. 4 and FIG. 6 the test vectors are applied as test signals. The test vectors may also be provided in the form of running predetermined test program instructions of a computer program running on the integrated circuit which are known to exercise the critical paths of the integrated circuit. In an end device the execution of such test software is more convenient to provide than the application of test vector signals. Furthermore, such execution may be more readily controlled by a supervising operating system or under control of appropriate interrupts and/or reset signals.

Subsequent to the running of the test vectors at step 70, step 72 determines whether or not the integrated circuit has properly completed the data processing operation specified and accordingly whether or not a pass result has been generated. If a pass result has been generated, then processing proceeds to step 73 at which a determination is made as to whether or not the minimum supply voltage within the span of the test set of voltages has been reached for that frequency. If the limit for the set has not yet been reached then step 76 decrements the current supply voltage value and processing returns to step 68. If the minimum supply voltage has been reached (this minimum being one constrained for example by the power supply circuit or fail safe minimums imposed by the design engineers), then processing proceeds to step 78 where an appropriate safety margin is added and the dynamic voltage controller 54 is programmed. Step 80 then determines whether or not all the required clock frequencies have yet been tested. If there are further clock frequencies to be tested, then the next of these is selected at step 82 and processing returns to step 66. If all of the required clock frequencies had been tested, then step 84 serves to restore the state of the integrated circuit using the state that initially saved at step 64.

If the test at step 72 indicates that the test vectors produced a fail result, then this has effectively determined the minimum required supplied voltage for the individual integrated circuit concerned to meet its critical path timings and step 74 serves to select the previously tested supply voltage level as the one to be subject to appropriate margin padding and use by the dynamic voltage controller 54 as programmed by step 78.

It will be appreciated that FIG. 9 illustrates the technique for establishing an operational supply voltage level determined for an individual integrated circuit at a plurality of different operating clock frequencies. A similar approach may be used to determine an operating body bias voltage level to be used during standby. However, the device measuring and reacting to the standby voltages and leakage currents would need to be separate and on its own voltage domain as it would need to keep operating when the other circuit were in standby. For the body bias voltage determination the clock is stopped and a plurality of body bias voltages utilised whilst measuring the leakage current drawn for each. Once the range of body bias voltages have been tested then the one which produced the least leakage current is determined and from this an appropriate operational body bias voltage determined by adding a suitable margin etc.

It will be appreciated that the above-described techniques for the supply voltage characterisation of an individual integrated circuit are only some examples of how this technique may be used. Further techniques which operating voltage bin individual integrated circuits may be utilised. Voltage binning of individual integrated circuits so as to enable selection of those with the best energy consumption characteristics and/or the tuning of the use of the integrated circuits to produce improved energy consumption performance for a particular integrated circuit may be achieved in a variety of ways in accordance with the above described general techniques and is strongly advantageous.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A method of determining an operating voltage for an individual integrated circuit, said method comprising:
   running said integrated circuit at a required operating frequency;
   executing a test sequence of data processing operations on said integrated circuit to exercise critical paths of said integrated circuit at each of at least a subset of a set of test voltages, wherein successful execution of said test sequence at a given test voltage indicates that said integrated circuit can reliably sustain said required operating frequency at said given test voltage;
   identifying a lowest test voltage from said subset of test voltages for which said test sequence was successfully executed;
   determining said operating voltage for said individual integrated circuit at said required operating frequency in dependence upon said lowest test voltage, wherein said method is performed whilst said integrated circuit is incorporated within an end device; and
   using said determined operating voltage to set the operating voltage for said integrated circuit.

2. A method as claimed in claim 1, wherein an operating voltage is determined for each of a plurality of required operating frequencies.

3. A method as claimed in claim 1, wherein said test sequence is one of:
   a sequence of data processing instructions; and
   a sequence of test signals applied to said integrated circuit.

4. A method as claimed in claim 1, wherein said operating voltage includes a supply level voltage.

5. A method as claimed in claim 1, wherein said operating voltage includes a body bias voltage.

6. A method as claimed in claim 1, wherein said operating voltage is determined such that it is higher than said lowest operating voltage by at least a predetermined margin.

7. A method as claimed in claim 1, wherein said subset of test voltages is derived from said set of test voltages by first executing said test sequence at a highest voltage of said set of test voltages and progressively reducing said test voltage and executing said test sequence until a test voltage of said set of test voltages is encountered at which successful execution of said test sequence fails.

8. A method as claimed in claim 1, wherein said operating voltage and said required operating frequency are stored in a storage module associated with said integrated circuit.

9. A method as claimed in claim 8, wherein said memory is programmable read only memory.

10. A method as claimed in claim 8, wherein said storage module is a bar code applied to packaging of said individual integrated circuit.

11. A method as claimed in claim 1, wherein said method is performed upon fabrication of said integrated circuit prior to incorporating said integrated circuit within a larger circuit.

12. A method as claimed in claim 1, wherein said method is performed upon coupling said integrated circuit to further circuit elements within a larger circuit.

13. A method as claimed in claim 1, wherein said method is performed at at least one of:
   a first boot of said end device; and
   every boot of said end device.

14. A method as claimed in claim 1, wherein said method is performed periodically during operation of said end device.

15. A method as claimed in claim 1, wherein said method is performed upon detection of one or more predetermined operating conditions of said end device.

16. A method as claimed in claim 14, wherein a state of said end device is saved prior to performing said method and said state is restored once said operating voltage has been determined.

17. A method as claimed in claim 15, wherein said predetermined operating conditions comprise whether said end device is operating from a mains power supply or a battery power supply.

18. A method as claimed in claim 1, wherein said method is performed upon detection of a predetermined temperature change of said end device.

19. A method as claimed in claim 1, wherein said end device comprises a battery operable to supply power to said end device and said end device can be set to a standby mode, said method comprising the steps of:
   setting said integrated circuit to a standby state; testing said integrated circuit at each of a set of test body bias voltages to identify a test body bias voltage that results in a lowest leakage current for a current charge level of said battery;
   setting an operational body bias voltage in said standby mode in dependence upon said identified test body bias voltage.

20. A method as claimed in claim 12, wherein said integrated circuit is categorised as belonging to a given voltage domain of a plurality of different voltage domains within said larger circuit or said end device respectively and said method is performed for said given voltage domain.

21. An apparatus comprising:
   an individual integrated circuit, said integrated circuit incorporated in an end device; and
   a storage module associated with said individual integrated circuit storing an operating voltage and a required operating frequency for said individual integrated circuit, the operating voltage having been determined by a method of:
   running said integrated circuit at said required operating frequency;
   executing a test sequence of data processing operations on said integrated circuit to exercise critical paths of said integrated circuit at each of at least a subset of a set of test voltages, wherein successful execution of said test sequence at a given test voltage indicates that said integrated circuit can reliably sustain said required operating frequency at said given test voltage;

identifying a lowest test voltage from said subset of test voltages for which said test sequence was successfully executed; and determining said operating voltage for said individual integrated circuit at said required operating frequency in dependence upon said lowest test voltage.

22. An apparatus as claimed in claim 21, wherein an operating voltage is determined for each of a plurality of required operating frequencies.

23. An apparatus as claimed in claim 21, wherein said test sequence is one of:

a sequence of data processing instructions; and a sequence of test signals applied to said integrated circuit.

24. An apparatus as claimed in claim 21, wherein said operating voltage includes a supply level voltage.

25. An apparatus as claimed in claim 21, wherein said operating voltage includes a body bias voltage.

26. An apparatus as claimed in claim 21, wherein said operating voltage is determined such that it is higher than said lowest operating voltage by at least a predetermined margin.

27. An apparatus as claimed in claim 21, wherein said subset of test voltages is derived from said set of test voltages by first executing said test sequence at a highest voltage of said set of test voltages and progressively reducing said test voltage and executing said test sequence until a test voltage of said set of test voltages is encountered at which successful execution of said test sequence fails.

28. An apparatus as claimed in claim 21, wherein said operating voltage and said required operating frequency are stored in a storage module associated with said integrated circuit.

29. An apparatus as claimed in claim 28, wherein said storage module is programmable read only memory.

30. An apparatus as claimed in claim 28, wherein said storage module is a bar code applied to packaging of said individual integrated circuit.

31. An apparatus as claimed in claim 21, wherein said method is performed upon fabrication of said integrated circuit prior to incorporating said integrated circuit within a larger circuit.

32. An apparatus as claimed in claim 21, wherein said method is performed upon coupling said integrated circuit to further circuit elements within a larger circuit.

33. An apparatus as claimed in claim 21 wherein said method is performed at at least one of:

a first boot of said end device; and every boot of said end device.

34. An apparatus as claimed in claim 21, wherein said method is performed periodically during operation of said end device.

35. An apparatus as claimed in claim 21, wherein said method is performed upon detection of one or more predetermined operating conditions of said end device.

36. An apparatus as claimed in claim 34, wherein a state of said end device is saved prior to performing said method and said state is restored once said operating voltage has been determined.

37. An apparatus as claimed in claim 35, wherein said predetermined operating conditions comprise whether said end device is operating from a mains power supply or a battery power supply.

38. An apparatus as claimed in claim 34, wherein said method is performed upon detection of a predetermined temperature change of said end device.

39. An apparatus as claimed in claim 34, wherein said end device comprises a battery operable to supply power to said end device and said end device can be set to a standby mode, said method comprising the steps of:

setting said integrated circuit to a standby state;

testing said integrated circuit at each of a set of test body bias voltages to identify a test body bias voltage that results in a lowest leakage current for a current charge level of said battery;

setting an operational body bias voltage in said standby mode in dependence upon said identified test body bias voltage.

40. An apparatus as claimed in claim 33 wherein said integrated circuit is categorised as belonging to a given voltage domain of a plurality of different voltage domains within said larger circuit or said end device respectively and said method is performed for said given voltage domain.

* * * * *